United States Patent
Tsai et al.

(10) Patent No.: US 8,736,006 B1
(45) Date of Patent: May 27, 2014

(54) BACKSIDE STRUCTURE FOR A BSI IMAGE SENSOR DEVICE

(71) Applicant: Taiwan Semiconductor Manufacturing Company, Ltd., Hsin-Chu (TW)

(72) Inventors: Shuang-Ji Tsai, Tainan (TW);
Dun-Nian Yaung, Taipei (TW);
Jen-Cheng Liu, Hsin-Chu (TW);
Feng-Chi Hung, Chu-Bei (TW);
Jeng-Shyan Lin, Tainan (TW);
Chun-Chieh Chuang, Tainan (TW);
Min-Feng Kao, Chiayi (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/831,469

(22) Filed: Mar. 14, 2013

(51) Int. Cl.
*H01L 33/00* (2010.01)
*H01L 31/0232* (2014.01)
*H01L 33/42* (2010.01)
*H01L 27/146* (2006.01)

(52) U.S. Cl.
CPC ............. *H01L 31/0232* (2013.01); *H01L 33/42* (2013.01); *H01L 27/14685* (2013.01)
USPC ........................................... 257/432; 438/70

(58) Field of Classification Search
CPC .............. H01L 27/14685; H01L 33/42; H01L 31/0232
USPC .......................... 257/59, 432, 433; 438/69, 70
See application file for complete search history.

(56) References Cited

U.S. PATENT DOCUMENTS

| | | | | |
|---|---|---|---|---|
| 8,471,300 | B2 * | 6/2013 | Park | 257/228 |
| 8,564,135 | B2 * | 10/2013 | Pyo | 257/773 |
| 2007/0238217 | A1 * | 10/2007 | Shih | 438/69 |
| 2013/0105926 | A1 * | 5/2013 | Kao | 257/432 |
| 2013/0193541 | A1 * | 8/2013 | Sun et al. | 257/432 |
| 2013/0234220 | A1 * | 9/2013 | Tayanaka et al. | 257/292 |
| 2013/0264671 | A1 * | 10/2013 | Yun et al. | 257/432 |
| 2013/0267058 | A1 * | 10/2013 | Lee et al. | 438/72 |
| 2013/0323875 | A1 * | 12/2013 | Park et al. | 438/70 |
| 2013/0335590 | A1 * | 12/2013 | Kurihara et al. | 348/222.1 |

* cited by examiner

*Primary Examiner* — Nathan Ha
(74) *Attorney, Agent, or Firm* — Haynes and Boone, LLP (57) ABSTRACT

Disclosed is a method of fabricating an image sensor device, such as a BSI image sensor, and so-fabricated image sensor, in which undesired neutralization of charges in BARC layers caused by opposite charges in metal shield grounds is prevented to reduce dark current and enhance device performance. The image sensor comprises a substrate having a plurality of radiation sensors formed adjacent its front surface, a first insulation layer formed over the back surface of the substrate, a BARC layer formed over the first insulation layer, a metal grid disposed over the BARC layer, one or more metal grounds extending from the metal ground into the substrate for grounding purpose, and a sidewall insulating layer disposed between the sidewall of each metal ground and the surrounding BARC layer. The sidewall insulating layer electrically insulates the metal grounds from the surrounding BARC layer.

20 Claims, 6 Drawing Sheets

BACKSIDE STRUCTURE FOR A BSI IMAGE SENSOR DEVICE

BACKGROUND

Semiconductor image sensors are used to sense radiation such as light. Complementary metal-oxide-semiconductor (CMOS) image sensors (CIS) and charge-coupled device (CCD) sensors are widely used in various applications such as digital still camera or mobile phone camera applications. These devices utilize an array of pixels in a substrate, including photodiodes and transistors that can absorb radiation projected toward the substrate and convert the sensed radiation into electrical signals. A back side illuminated (BSI) image sensor device is one type of image sensor devices. These BSI image sensor devices are operable to detect light from its backside.

The conventional sensor, called the "front side illumination (FSI)" image sensor for these CMOS chips, is constructed in a fashion similar to the human eye, and has a lens at the front, layers of metal having wiring in the middle, and photo detectors on a silicon substrate (which absorbs the light) at the back. These metal layers may not only deflect the light on the sensor, they could also reflect it, reducing the incoming light captured by the photo detectors. By contrast, the back side illuminated sensor has the same elements as FSI, but orients the wiring behind the photo detectors layer by flipping the silicon wafer during manufacturing and then thinning its reverse side so that light will hit the silicon first, and the photo detectors layer without passing through the wiring layer. This change can improve the chance of an input photon being captured from about 60% to over 90%, and the sensitivity per unit area to deliver better low-light shots.

A BSI image sensor device typically has a radiation-absorption region, a periphery region or a radiation-blocked region, and a bonding pad region. The radiation-absorption region has a silicon substrate that includes an array or grid of pixels formed inside for sensing and recording an intensity of electromagnetic radiation or wave (such as light) entering the substrate from the backside, and some circuitry and input/outputs adjacent the grid of pixels for providing an operation environment for the pixels and for supporting external communication with the pixels. After the grid of pixels and the circuitry and input/outputs are formed within the substrate, the substrate is thinned from its backside to a desired thickness, the backside of the substrate in the radiation-absorption region is covered by one or more bottom anti-reflective coating (BARC) layers or films and a buffer oxide layer or film. The radiation-blocked region includes devices that need to be kept optically dark such as an application-specific integrated circuit (ASIC) device, a system-on-chip (SOC) device, a logic circuit, or a reference or calibration pixel that is used to establish a baseline of an intensity of light. For that, a conductive layer including a metal grid and a metal shield ground is formed over the BARC layers. The metal grid blocks external radiation from entering the substrate in this radiation-blocked region, and the metal shield ground releases charges on the metal grid collected and/or induced during wafer processes to the substrate, which is grounded.

BARC layers are made, in some cases, of high dielectric constant ("K") material and mostly have accumulated charges (mostly negative but in some case positive). The charge accumulated layer of the BARC films play an important role in improving dark current, white pixel, and dark image non-uniformity (DINU) quality issues. Such an undesired neutralization of the BARC layers by the excess charges on the metal shield ground causes. When the BARC layers have negative (positive) charges accumulated, they attract positive (negative) charges in the substrate to the BARC/substrate interface to form electric dipoles. And the electric dipoles play the role of a charge barrier, trapping the imperfections or defects such as dangling bonds.

In that regard, the performance of a metal ground in effectively releasing charges collected on the metal grid is highly important for quality control and cross-talk improvement. The problem, however, is that imperfections in the interface inevitably present between the metal ground and the substrate damage the performance. When the performance of the metal ground is not good enough, the excess charges accumulated on the metal ground tend to neutralize the negative charges present in the adjacent BARC layers. When the electric dipoles become destroyed by such neutralization of the BARC layers, the un-trapped imperfections or defects contribute to dark currents, cause DINU failures, and impairs quality of the device.

Therefore, in order to have the BARC layers in a BSI image sensor device efficiently trap the imperfections or defects, and thereby reduce dark currents and DINU and enhance the quality and performance of the device, it is desirable to provide a system and a method of preventing the undesired neutralization of the accumulated charges in the BARC layers by the excess charges accumulated on a metal shield ground.

BRIEF DESCRIPTION OF THE DRAWINGS

Aspects of the present disclosure are understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
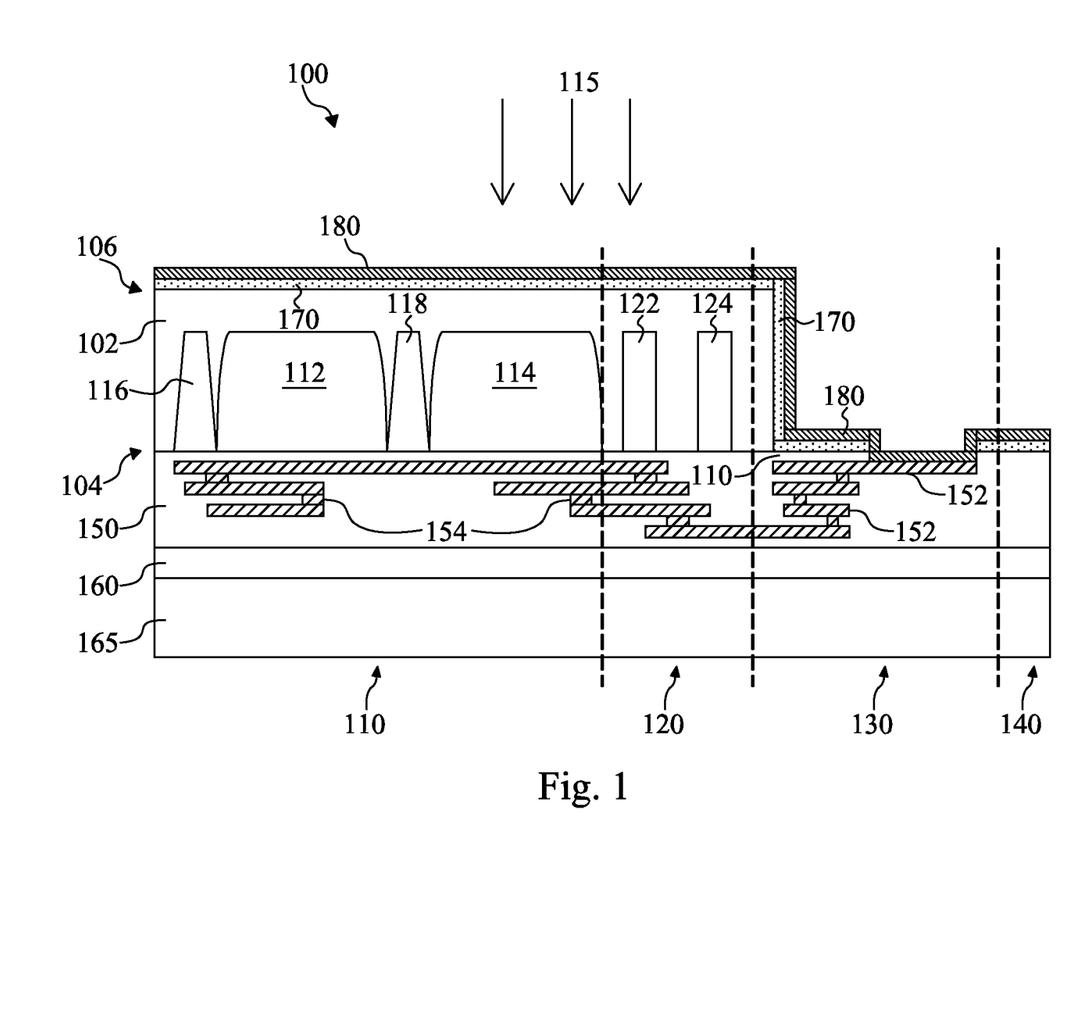
FIG. 1 is a schematic cross-sectional side view of a back side illuminated (BSI) image sensor device fabricated according to an aspect of the present disclosure.

FIG. 1 is a diagrammatic cross-sectional side view of a back side illuminated (BSI) image sensor device 100 fabricated according to an aspect of the present disclosure. The image sensor device 100 includes an array or grid of pixels for sensing and recording an intensity of electromagnetic radiation or wave (such as light) directed toward a back-side thereof. The image sensor device 100 may include a charge-coupled device (CCD), complimentary metal oxide semiconductor (CMOS) image sensor (CIS), an active-pixel sensor (APS), or a passive-pixel sensor. The image sensor device 100 further includes additional circuitry and input/outputs that are provided adjacent to the grid of pixels for providing an operation environment for the pixels and for supporting external communication with the pixels. It is understood that FIG. 1 has been simplified for a better understanding of the inventive concepts of the present disclosure and may not have been drawn to scale.

With reference to FIG. 1, the image sensor device 100 generally has a radiation-absorption region 110, a periphery region 120, a bonding pad region 130, and a scribe line region 140. The dashed lines in FIG. 1 designate the approximate boundaries between the regions 110, 120, 130, and 140. It is understood that these regions 110, 120, 130, and 140 extend vertically above and below the device substrate 102. The radiation-absorption region 110, to be described more in detail herein below, includes silicon substrate 102 that receives radiation and radiation-detection devices formed therein. The periphery region 120 may include other devices 122 and 124 that need to be kept optically dark. For example, the device 122 in an embodiment may be a digital device, such as an application-specific integrated circuit (ASIC) device or a system-on-chip (SOC) device. The other device 124 may be a reference pixel that is used to establish a baseline of an intensity of light for the image sensor device 100. The bonding pad region 130 may include one or more conductive bonding pads or E-pads, through which electrical connections between the image sensor device 100 and outside devices may be established. The scribe line region 140 may be the region that separates one semiconductor die that includes the bonding pad region 130, the periphery region 120, and the radiation-absorption region 110) from an adjacent semiconductor die (not illustrated). The scribe line region 140 is cut in a later fabrication process to separate adjacent dies before the dies are packaged and sold as integrated circuit chips. The scribe line region 140 is cut in such a way that the semiconductor devices in each die may not be damaged.

Still referring to FIG. 1, the radiation-absorption region 110 includes a device substrate 102. The device substrate 102 is a silicon substrate doped with a p-type dopant such as boron (for example a p-type substrate) or an n-type dopant such as phosphorous or arsenic (an n-type substrate). The substrate 102 may be comprised of a single semiconducting material such as bulk silicon or any other suitable elementary semiconducting materials, such as germanium in crystal; a compound semiconductor, such as silicon carbide, silicon germanium, gallium arsenic, gallium phosphide, indium phosphide, indium arsenide, and/or indium antimonide; or combinations thereof. The substrate 102 may also include an insulator layer on top of the semiconductor layer. The insulator layer comprises any suitable material, including silicon oxide, sapphire, other suitable insulating materials, and/or combinations thereof. An exemplary insulator layer may be a buried oxide layer (BOX). The insulator is formed by any suitable process, such as separation by implantation of oxygen (SIMOX), thermal oxidation, deposition, and/or other suitable process. Alternatively, the substrate 102 may further include another semiconductor layer on top of an insulator layer to form a silicon-on-insulator (SOI) substrate, which can be fabricated using wafer bonding, and/or other suitable methods. The substrate 102 may comprise any suitable crystallographic orientation (e.g., a (100), (110), (111), or (001) crystallographic orientation).

The substrate 102 has a front side 104 and a back side 106. The typical thickness of the device substrate 102 may range between about 100 microns (um) and 3000 um. In the device substrate 102, radiation-sensing regions 110 may be formed, which includes radiation-detection devices, pixels 112 and 114. The pixels 112 and 114 are operable to sense radiation, such as an incident light 115, that is projected toward the back side 106 of the device substrate 102. Each of the pixels 112 and 114 may include a photodiode in one embodiment. In another embodiment, the pixels 112 and 114 may include pinned layer photodiodes, photogates, reset transistors, source follower transistors, and transfer transistors.

The pixels 112 and 114, though drawn schematically identically, may be varied from one another to have different junction depths, thicknesses, widths, and so forth. Also, only two pixels are illustrated in FIG. 1 for the sake of simplicity, but it is understood that any number of radiation-detection devices may be implemented in the device substrate 102. In one embodiment shown, the pixels 112 and 114 may be formed by performing a suitable implantation process on the device substrate 102 from the front side 104. The implantation process may include doping the device substrate 102 with a p-type dopant such as boron or an n-type dopant such as phosphorous or arsenic. In another embodiment, the pixels 112 and 114 may also be formed by a diffusion process.

Continuing to refer to FIG. 1, the radiation-absorption region 110 of the device substrate 102 may further include isolation structures, for example, isolation structures 116 and 118, which provide electrical and optical isolation between the pixels 112 and 114. The isolation structures 116 and 118 may include shallow trench isolation (STI) structures that are formed of a dielectric material such as silicon oxide or silicon nitride. The STI structures are formed by etching trenches or openings into the substrate 102 from the front side 104 and thereafter filling the openings with the dielectric material. In other embodiments, the isolation structures 116 and 118 may include doped isolation features, such as heavily doped n-type or p-type regions. It is understood that the isolation structures 116 and 118 are formed before the pixels 112 and 114. Again, only two isolation structures 116 and 118 are illustrated in FIG. 1 for the sake of simplicity, but it is understood that any number of isolation structures may be implemented in the device substrate 102 so that the radiation-sensing regions such as pixels 112 and 114 may be properly isolated.

Still referring to FIG. 1, the image sensor device 100 may further have an interconnect structure 150 formed over the front side 104 of the device substrate 102. The interconnect structure 150 may include a plurality of patterned dielectric layers and conductive layers that provide interconnections (e.g., wiring) between the various doped features, circuitry, and input/output of the image sensor device 100. The interconnect structure 100 may further include an interlayer dielectric (ILD) 110 and a multilayer interconnect (MLI) structure. The MLI structure includes contacts, vias and metal lines. For the purposes of illustration, a plurality of conductive metal lines 152 and vias/contacts 154 are shown in FIG. 1. It should be understood that the conductive lines 152 and vias/contacts 154 illustrated are merely exemplary, and the actual positioning and configuration of the conductive lines 152 and vias/contacts 154 may vary depending on design needs. The MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (PVD) (or sputtering), chemical vapor deposition (CVD), atomic layer deposition (ALD), or combinations thereof. Other manufacturing techniques to form the aluminum interconnect may include photolithography processing and etching to pattern the conductive materials for vertical connection (for example, vias/contacts) and horizontal connection (for example, conductive lines). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect structure may be formed by a technique including CVD, sputtering, plating, or other suitable processes.

Still referring to FIG. 1, the image sensor device 100 may further include a buffer layer 160 formed on the interconnect structure 150. In the present embodiment, the buffer layer 160 includes a dielectric material such as silicon oxide. Alternatively, the buffer layer 160 may optionally include silicon nitride. The buffer layer 160 is formed by CVD, PVD, or other suitable techniques. The buffer layer 160 may be planarized to form a smooth surface by a chemical mechanical polishing (CMP) process.

Thereafter, a carrier substrate 165 may be further bonded with the device substrate 102 through the buffer layer 160, so that processing the back side 104 of the device substrate 102 can be performed. The carrier substrate 165 in the present embodiment is similar to the substrate 102 and includes a silicon material. Alternatively, the carrier substrate 165 may include a glass substrate or another suitable material. The carrier substrate 165 may be bonded to the device substrate 102 by molecular forces—a technique known as direct bonding or optical fusion bonding—or by other bonding techniques known in the art, such as metal diffusion or anodic bonding.

The buffer layer 160 provides electrical isolation between the device substrate 102 and the carrier substrate 165. The carrier substrate 165 provides protection for the various features formed on the front side 104 of the device substrate 102, such as the pixels 112 and 114. The carrier substrate 165 also provides mechanical strength and support for processing the back side 106 of the device substrate 102 as discussed below. After bonding, the device substrate 102 and the carrier substrate 165 may optionally be annealed to enhance bonding strength.

Still referring to FIG. 1, after finishing the CMOS processes on the front side of the substrate, the substrate 102 is flipped and a thinning process is performed from the backside 106 to thin the device substrate 102. The thinning process may include a mechanical grinding process and a chemical thinning process. A substantial amount of substrate material may be first removed from the device substrate 102 during the mechanical grinding process. Afterwards, the chemical thinning process may apply an etching chemical to the back side 106 of the device substrate 102 to further thin the device substrate 102 to a desired thickness. When the substrate 102 is a SOI type, the imbedded buried oxide layer (BOX) can act as an etching stop layer. Typically, the thickness of the substrate in a BSI image sensor is 5-10 µm. In an embodiment, the thickness may be less than 5 µm, even down to 2-3 µm. The thickness of the device substrate 102 may be implemented depending on the type of application and design requirements of the image sensor device 100.

After thinning the substrate 102 to a desired thickness, the substrate 102 in the bonding pad region 130 is removed by an etching process, starting from the back side 106 of the substrate 102, until an interlayer dielectric layer (ILD) 156 on the interconnect structure 100 is exposed to form a bonding pad structure thereon. FIG. 1 shows the bonding pad region 130 after the substrate 102 has been already removed.

Still referring to FIG. 1, an oxide layer 170 is formed over the back side 106 of the device substrate 102 and over the exposed surface of the ILD layer 156 in the bonding pad region 130. Then, a portion of the buffer oxide layer 170 in the bonding pad region 130 is further etched to expose a portion of the top-most conductive line 152 in the interconnect structure 100, on which a bonding pad will be formed. Over the oxide layer 170, one or more layers of bottom anti-reflective coating (BARC) (not shown) is formed. In an embodiment, an additional oxide layer (not shown), called a buffer oxide layer, may be further formed over the BARC layers.

Thereafter, a conductive layer 180 is formed over the buffer oxide layer and also over the exposed conductive line 152 in the bonding pad region 130. In an embodiment, the conductive layer 180 includes a metal or a metal alloy material, for example aluminum (Al) or an aluminum copper alloy (AlCu). The portion of the conductive layer 180 that comes into physical contact with the top-most conductive line 152 in the bonding pad region 130 will be patterned into a bonding pad later.

Next, an etching process is performed to remove the portion of the conductive layer 180 covering the radiation-absorption region 110 up to the level of the buffer oxide layer, so that radiation may enter the substrate 102 through the buffer oxide layer, BARC layers, the oxide layer 170 to reach the pixels 112 and 114 in the substrate 102 without being obstructed by the conductive layer 180 (likely opaque). FIG. 1 shows the conductive layer 180 before the removal of the portion of the conductive layer 180 in the radiation-absorption region 110. The etching process also removes a portion of the conductive layer 180 in the bonding pad region 130 as well in a manner such that the remaining portion of the conductive layer 130 in the bonding pad region 130 forms a conductive bonding pad.

After removal of the conductive layer 180 covering the radiation-absorption region 110, the exposed buffer oxide layer in the radiation-absorption region 110 may be thinned to a key thickness to act, together with the BARC layers below, as an optical film such that the radiation entering the substrate 102 may suffer little reflection on the surface of the substrate and be absorbed by the substrate 102 in maximum. In that sense, the buffered oxide layer operates as one of the BARC layer.

Thereafter, though not illustrated in FIG. 1, an additional processing may be performed to complete the fabrication of the image sensor device 100. For example, a passivation layer may be formed around the image sensor device for protection (for example against dust or humidity). Color filters may be formed within the radiation-absorption region 110. The color filters may be positioned such that the incoming light is directed thereon and therethrough. The color filters may include a dye-based (or pigment based) polymer or resin for filtering a specific wavelength band of the incoming light, which corresponds to a color spectrum (e.g., red, green, and blue). Thereafter, micro-lenses are formed over the color filters for directing and focusing the incoming light toward specific radiation-sensing regions in the device substrate 102, such as pixels 112 and 114. The micro-lenses may be positioned in various arrangements and have various shapes depending on a refractive index of material used for the micro-lens and distance from a sensor surface. It is also understood that the device substrate 102 may also undergo an optional laser annealing process before the forming of the color filters or the micro-lenses.

Figure 2A:
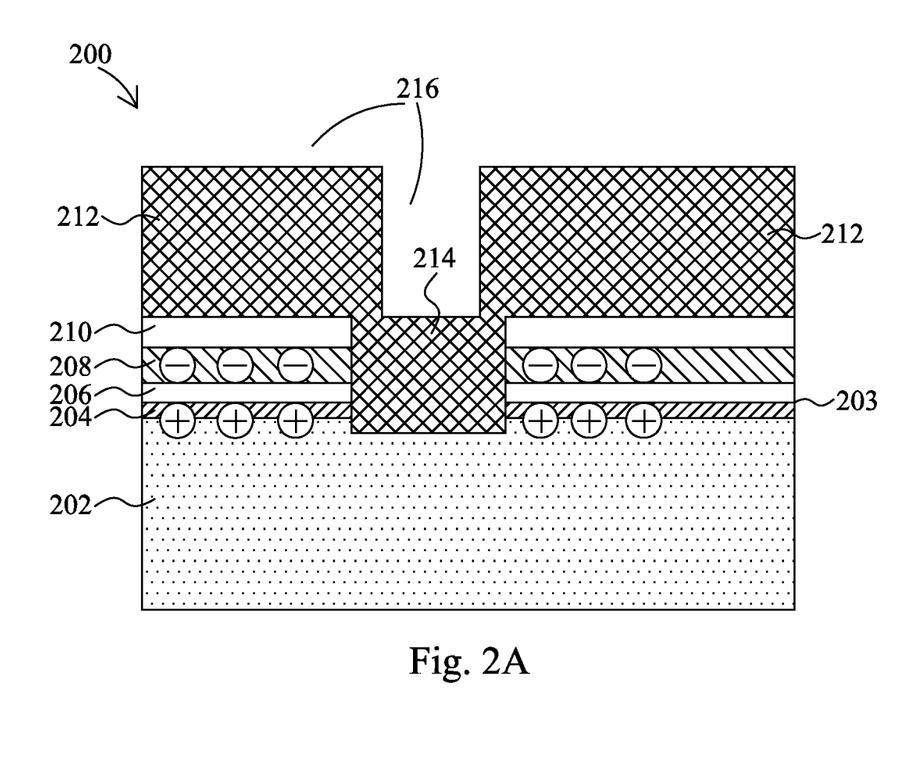
FIGS. 2A and 2B are schematic cross-sectional side views of an upper portion of a BSI image sensor device in the radiation-blocking region conventionally made in a current art.
Figure 2B:
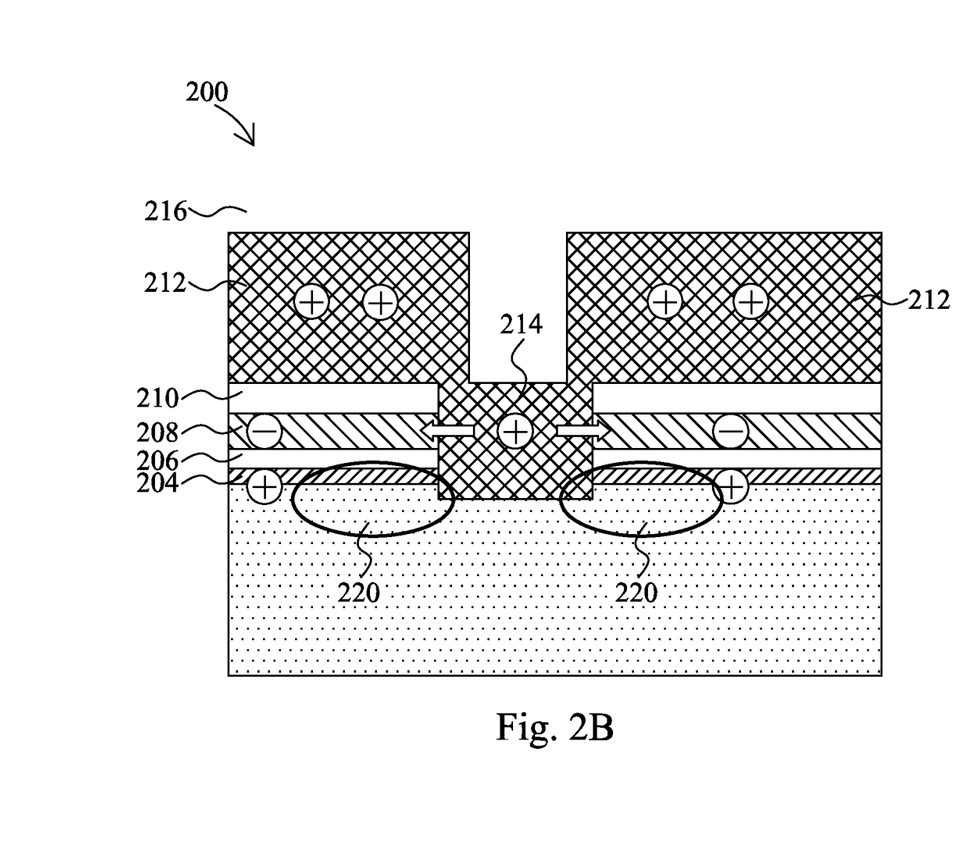

FIGS. 2A and 2B are schematic cross-sectional side views of an upper portion of a BSI image sensor device 200 in the radiation-blocking region, or a periphery region, conventionally made in a current art. The upper portion of a BSI image sensor device 200 includes a substrate 202, an oxide layer 204 formed over the back side 203 of the substrate 202, bottom anti-reflective coating (BARC) layers or films 206 and 208, a buffer oxide layer 210, a metal grid 212, a metal shield ground 214, and an additional oxide layer 216. The a metal shield ground 214 is extended vertically from the horizontal metal grid 212 and reaches into the substrate 202, which is grounded, for releasing thereto any charges (mostly positive) collected on the metal grid 212 during the wafer processes. FIG. 2A depicts an ideal situation where the BARC layers have negative charges accumulated thereon and positive charges are attracted to the substrate/oxide layer interface 203 to form electric dipoles. The electric dipoles, acting as a charge barrier, trap the imperfections or defects such as dangling bonds, and thereby reduce dark currents and DINU to enhance the quality and performance of the device. FIG. 2B depicts the problem encountered when the performance the metal shield ground 214 is not good enough, mostly because of imperfections present in the metal shield ground/substrate interface. The positive charges collected on the metal grid 212, instead of being released into the substrate 202, flow into the BARC layers 206 and 208 abutting the metal shield ground 214, neutralize the negative charges in a region 220 of the BARC layers 206 and 208 surrounding the metal shield ground 214, and thereby destroy the electric dipoles in the region 220. FIG. 2B shows such an electric dipole-free region 220 around the metal shield ground 214.

Figure 3:
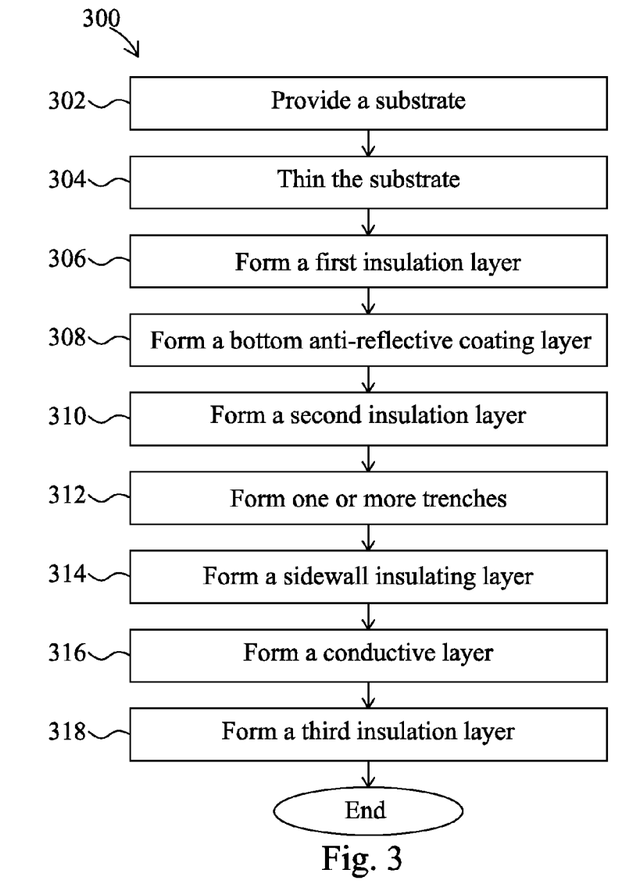
FIG. 3 is a flowchart of a method for fabricating a portion of a back-side illuminated (BSI) image sensor, more particularly, for forming a sidewall insulation layer in a radiation-absorption region, according to an aspect of the present disclosure.

FIG. 3 is a flowchart of a method 300 for fabricating an image sensor device, such as a back-side illuminated (BSI) image sensor, according to an aspect of the present disclosure. In describing method 300 herein, FIGS. 4A-4F are referred to together, which illustrate schematically partial steps performed in the method 300 in an aspect of the present disclosure. The image sensor device, for which the method 300 is practiced, comprises a radiation-absorption region and a radiation-blocking region. The radiation-absorption region receives radiation which is detected by radiation-detection devices such as pixels formed therein. The radiation-blocking region, which was referred to as the periphery region in describing in FIG. 1, is where devices that need to be kept optically dark are present, such as an application-specific integrated circuit (ASIC) device, a system-on-chip (SOC) device, a logic circuit, or a reference or calibration pixel that is used to establish a baseline of an intensity of light.

In the first step of the method 300, the step 302, a substrate is provided. Herein, the word 'provide' is used in a broad sense to encompass all modes of procuring the substrate, including, but not limited to, 'purchasing', 'preparing', 'manufacturing', 'arranging,' or 'making in order' the object, which is the substrate. The substrate extends across the radiation-absorption and radiation-blocking regions and has a front side and a back side. The substrate may be comprised of a single semiconducting material such as bulk silicon or any other suitable elementary semiconducting materials, such as germanium in crystal; a compound semiconductor, such as silicon carbide, silicon germanium, gallium arsenic, gallium phosphide, indium phosphide, indium arsenide, and/or indium antimonide; or combinations thereof, and may be doped with a p-type dopant such as boron (for example a p-type substrate) or an n-type dopant such as phosphorous or arsenic (an n-type substrate). The substrate may also include an insulator layer on top of the semiconductor layer. The insulator layer comprises any suitable material, including silicon oxide, sapphire, other suitable insulating materials, and/or combinations thereof. An exemplary insulator layer may be a buried oxide layer (BOX). The insulator is formed by any suitable process, such as separation by implantation of oxygen (SIMOX), oxidation, deposition, and/or other suitable process. Alternatively, the substrate may further include another semiconductor layer on top of an insulator layer to form a silicon-on-insulator (SOI) substrate, which can be fabricated using wafer bonding, and/or other suitable methods. The substrate may comprise any suitable crystallographic orientation (e.g., a (100), (110), (111), or (001) crystallographic orientation). Typically, the thickness of the substrate may range between about 100 microns (um) and 3000 um.

In the radiation-absorption region, the substrate has a plurality of radiation sensors, called pixels, formed adjacent its front surface through CMOS processes. Each of the radiation sensors is operable to sense radiation entering the substrate through its back surface and may include a photodiode in one embodiment. In another embodiment, the radiation sensors may include pinned layer photodiodes, photogates, reset transistors, source follower transistors, and transfer transistors. In one embodiment, the radiation sensors may be formed by performing a suitable implantation process on the substrate from the front side. The implantation process may include doping the substrate with a p-type dopant such as boron or an n-type dopant such as phosphorous or arsenic. In another embodiment, the radiation sensors may also be formed by a diffusion process.

The substrate may further include isolation structures, which provide electrical and optical isolation between the radiation sensors. The isolation structures may include shallow trench isolation (STI) structures that are formed of a dielectric material such as silicon oxide or silicon nitride. The STI structures are formed by etching trenches or openings into the substrate from the front side and thereafter filling the openings with the dielectric material. In other embodiments, the isolation structures may include doped isolation features, such as heavily doped n-type or p-type regions. The isolation structures may be formed before the radiation sensors in an embodiment.

After providing the substrate, then at step 304, the substrate is thinned from the back surface to a suitable value of predetermined thickness. The thinning process may include a mechanical grinding process and a chemical thinning process. A substantial amount of substrate material may be first removed from the device substrate during the mechanical grinding process. Afterwards, the chemical thinning process may apply an etching chemical to the back side of the substrate to further thin the substrate to a desired thickness. When the substrate is a SOI type, the imbedded buried oxide layer (BOX) can act as an etching stop layer. Typically, the thickness of the substrate in a BSI image sensor is 5-10 μm. In an embodiment, the thickness may be less than 5 μm, even down to 2-3 μm. The thickness of the substrate may be implemented depending on the type of application and design requirements of the image sensor device.

Referring to FIG. 3, at step 306, a first insulation layer is formed over the back surface of the substrate. The first insulation layer may include a dielectric material such as, in an embodiment, silicon oxide. Alternatively, the first insulation layer may optionally include silicon nitride. The oxide layer may be formed by CVD, PVD, thermal oxidization, spin-on coating, spin-on dielectric (SOD) process, or other suitable techniques. The first insulation layer may be planarized to form a smooth surface by a chemical mechanical polishing (CMP) process. The first insulation layer provides electrical isolation for the substrate.

Still referring to FIG. 3, at step 308, one or more bottom anti-reflective coating (BARC) layer(s) may be formed on the back surface of the substrate to increase the absorption of the incoming radiation to the substrate, and thereby enhance the efficiency of the image sensor device. The reduction in reflections also improves the contrast of the image by elimination of stray light and reduces image distortions associated with reflections at the surface of the substrate. The BARC layer(s) also play an important role of trapping lattice imperfections or defects by electric dipoles formed from negative charges accumulated in the BARC layers and positive charges attracted to the substrate interface by electrical induction. The BARC layer(s) may comprise transparent thin film structures with alternating layers of dielectric materials of contrasting refractive index. In one embodiment, the BARC layers may be comprised of high K material such as a hafnium oxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, titanium nitride (TiN). In another embodiment, the BARC layers may be formed from any of the three families of materials, the G-line, I-line, or DUV, commonly used for BSI image sensor device. In one embodiment, the layers of silicon nitride and silicon oxide (SiN/SiO) may be used. In another embodiment, a layer of silicon carbide (SiC) may be used. But the BARC layer may comprise any other suitable material known in the art.

The BARC layer may be formed by CVD, PVD, thermal oxidization or other suitable techniques. The individual layer thicknesses are chosen to produce destructive interference in the beams reflected from the interfaces, and constructive interference in the corresponding transmitted beams so that the absorption of incident radiation may be maximized at surface of the substrate. The BARC layer may be made of either inorganic material, which can be deposited on the substrate in a special deposition chamber, or organic material, which can be applied like a photoresist without having to use the expensive deposition chamber.

Continuing to refer to FIG. 3, at step 310, a second insulation layer is formed over the BARC layer(s). The second insulation layer may be a buffer oxide layer in an embodiment. The dielectric material used for the second insulation layer may be the typical undoped and doped silicon dioxide ($SiO_2$), silicon oxynitride (SiON), silicon nitride ($Si_3N_4$), high-density plasma (HDP) oxides, TEOS oxides, high-k dielectric material such as a hafnium oxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, or any other suitable materials, or combinations thereof. In some embodiments, the second insulation layer may have a multi-layer structure such as a thermal oxide liner layer filled with silicon nitride or silicon oxide. The oxide layer may be formed by CVD, PVD, thermal oxidization, spin-on coating, spin-on dielectric (SOD) process, or other suitable techniques. The second insulation layer may be planarized to form a smooth surface by a chemical mechanical polishing (CMP) process.

Figure 4A:
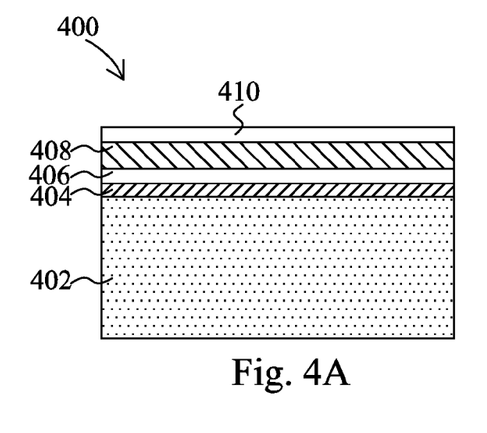
FIG. 4A-4F schematically show partial steps of the method illustrated in FIG. 3 according to an aspect of the present disclosure.

FIGS. 4A-4F schematically show cross-sectional side views of a top portion 400 of an image sensor device in the radiation-blocking zone while partial steps of the method 300 in an aspect of the present disclosure are being performed. FIG. 4A shows such a top portion 400 of an image sensor device when the method 300 has been performed up to the step 310. After finishing the step 310, the top portion 400 includes a substrate 402 including radiation sensors, a first insulation layer 404 such as an oxide layer, one or more BARC layers 406 and 408 formed over the back surface of the substrate 402, and a second insulation layer 410, another oxide layer called a buffer oxide layer.

Figure 4B:
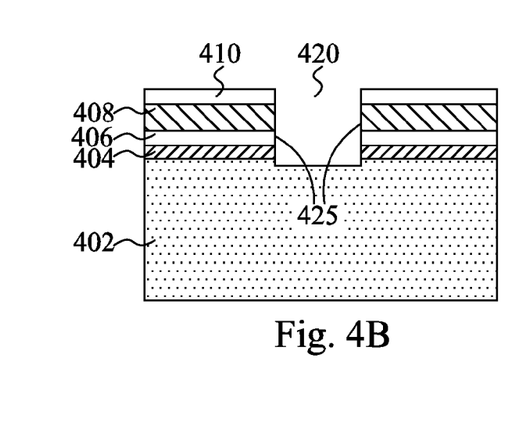

Now, referring back to FIG. 3, at step 312, one or more trenches are formed for disposing metal shield grounds by photolithography patterning and etching processes. FIG. 4B shows part of the top portion 400 of an image sensor device after the trenches 420 are formed at step 312. For simplicity, only one of such trenches is shown in FIG. 4B. Each trench 420 extend from the top surface of the second insulation layer 410, penetrating through the second insulation layer 410, the BARC layers 406 and 408, the first insulation layer 404, and reach partly into the substrate 402. Each trench 420 has an inner trench wall 425 defined by side sections of the BARC layer 406 and 408, the first and second insulation layers 404 and 410, and part of the substrate 402.

The photolithography patterning processes to form the trenches 420 may include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process may be implemented or replaced by other proper methods such as mask-less photolithography, electron-beam writing, and ion-beam writing.

More particularly, a photoresist ("PR") layer is coated upon the second insulation layer 410 for patterning. The photoresist may be any suitable material used in the art, such as Poly(methyl methacrylate) (PMMA), Poly(methyl glutarimide) (PMGI), Phenol formaldehyde resin (DNQ/Novolac), SU-8, and may be either positive or negative photoresist. These materials are all applied as a liquid and, generally, spin-coated to ensure uniformity of thickness. After prebaking, the photoresist layer is exposed to an ultraviolet (UV), deep ultraviolet (DUV) or electron beam through a pattern via a photomask. The exposure to light causes a chemical change that allows some of the photoresist to be removed by a special solution, called "developer" by analogy with photographic developer. For positive photoresist, the most common type, the exposed part becomes soluble in the developer. After going through a post-exposure baking process, the remaining (unexposed) parts form masks (not shown) that resist etching. In an embodiment, the masks may be patterned to be equal spaced, for equal spaced trenches. The pitch between the masks may be adjusted differently depending on design needs and applications.

Next, an etching is performed upon the second insulation layer 410 to remove the areas thereof that are not protected by photoresist masks. The etching stops at a predetermined depth from the back surface of the substrate 402. For that purpose, an etch stop layer may have been imbedded into the substrate 402 in one embodiment. At this step 312, any known etching processes may be used, such as wet etching, dry etching, or plasma etching, but when an anisotropic etching is desired, a plasma etching may be used. The etchants that may be used for polymer etching may include, but are not limited to, wet etchants such as potassium hydroxide (KOH), ethylene diamine and pyrocatechol (EDP), or Tetramethylammonium hydroxide (TMAH), or plasma etchants such as $Cl_2$, $CCl_4$, $SiCl_2$, $BCl_3$, $CCl_2F_2$, $CF_4$, $SF_6$, or $NF_3$. After etching portions of the layers of the first and second insulation layers 404 and 410, the BARC layers 406 and 408, and part of the substrate 402 that were uncovered by the photoresist masks to form one or more trenches, the photoresist masks are removed by a process called ashing. This usually requires a liquid "resist stripper", which chemically alters the resist so that it no longer adheres to the second insulation layers 410. Alternatively, the photoresist masks may be removed by a plasma containing oxygen, which oxidizes it.

Figure 4C:
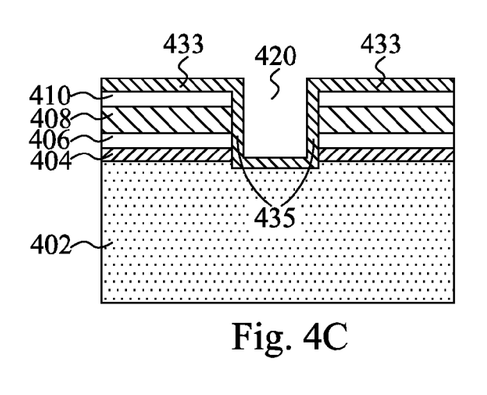

Referring back to FIG. 3, at step 314, a sidewall insulating layer is formed around each inner trench wall 425 in FIG. 4B. The sidewall insulating layer is formed largely in two sub steps. First, a dielectric or an oxide material such a silicon oxide is deposited upon the second insulation layer 410 and the one or more trenches 420 to form an oxide layer. Alternatively, the oxide layer may optionally include silicon nitride. The oxide layer may be formed by CVD, PVD, thermal oxidization, spin-on coating, spin-on dielectric (SOD) process, or other suitable deposition techniques. In an embodiment, the oxide layer may be planarized to form a smooth surface by a chemical mechanical polishing (CMP) process. FIG. 4C shows such an oxide layer 430, which has a horizontal portion 433, formed upon the second insulation layer 410 and the one or more trenches 420, and a vertical portion 435 that is formed around each inner trench wall 425.

Figure 4D:
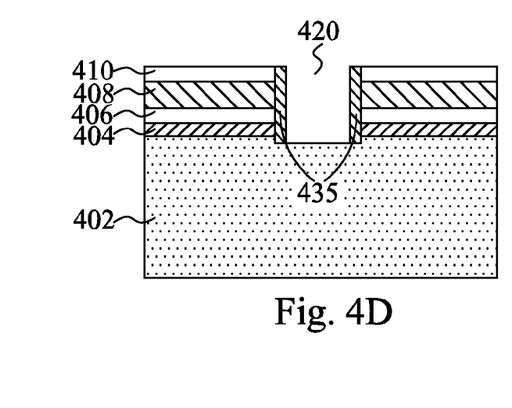

Next, the horizontal portion 433 of the oxide layer 430 is removed by a blanket etching process. Again, any known etching processes may be used here, such as wet etching, dry etching, or plasma etching. When an anisotropic etching is desired for sharply defined edges, a plasma etching may be used. The etchants that may be used for polymer etching may include, but are not limited to, wet etchants such as potassium hydroxide (KOH), ethylene diamine and pyrocatechol (EDP), or Tetramethylammonium hydroxide (TMAH), or plasma etchants such as $Cl_2$, $CCl_4$, $SiCl_2$, $BCl_3$, $CCl_2F_2$, $CF_4$, $SF_6$, or $NF_3$. FIG. 4D shows the remaining portion of the oxide layer 430, the vertical portion 435, after the blanket etching process. The horizontal portion 433 of the oxide layer 430 has been removed, exposing the second insulation layer 410 and the substrate 402 at the bottom of the trenches 420. The remaining vertical portion 435 of the oxide layer 430 becomes the sidewall insulating layer 435, which would electrically insulate a metal shield ground to be formed within the trench 420 in a subsequent step from the surround layers, especially from the BARC layers 406 and 408, so that any undesired leakage of charges in the metal shield ground into the BARC layers 406 and 408 may be prevented.

The thickness of the sidewall insulating layer 435 can be well controlled to have a desired value during the deposition of the oxide layer 430 and etching by adjusting the deposition rate and etching time. In one embodiment of the present disclosure, the thickness may range between 1-500 nanometers (nm). But depending on the design needs for different applications of the image sensor device, the thickness can be varied beyond that range in other embodiments.

Now referring back to FIG. 3, now at step 316, a conductive layer is formed over the second insulation layer 410 in the radiation-blocking region, and on the exposed surface of the substrate 402 at the bottom of the trenches 420 by a suitable deposition process. In actuality, at this step, conductive material may be deposited over the second insulation layer 410 both in the radiation-absorption region and radiation-blocking region. Since external radiation should be allowed to enter the radiation-absorption region, the portion of the conductive layer in the radiation-absorption region is subsequently removed by a suitable etching process, as partly shown in FIG. 4E. In an embodiment, the conductive material deposited may be a metal or a metal alloy material, for example, copper (Cu), aluminum (Al), an aluminum copper alloy (AlCu), or tungsten. The deposition process may be any process known in the art, including physical vapor deposition (PVD) (or sputtering), chemical vapor deposition (CVD), atomic layer deposition (ALD), plating, or combinations thereof, or other suitable processes.

Figure 4E:
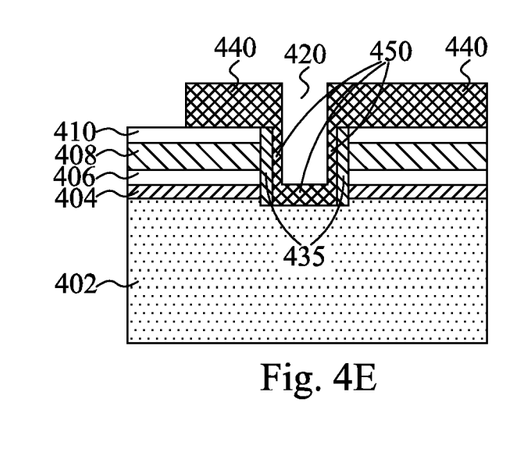

FIG. 4E shows the conductive layer formed at step 316 in the radiation-blocking region of an image sensor device. The conductive layer comprises two portions, horizontal portion 440 and one or more vertical portions 450. Like the trenches 420, for simplicity, only one of such vertical portions 450 is shown in FIG. 4E. The horizontal portion of the conductive layer disposed over the second insulation layer 410 is the metal grid 440 that blocks external radiation from entering the radiation-blocking region. On this metal grid 440 are collected charges (mostly positive) generated from various sources during the previous wafer processes and the steps of the method 300, which need to be discharged. The one or more vertical portions 450 of the conductive layer become the metal shield grounds 450 for releasing those charges to the ground through the substrate 402 that is grounded. The metal shield grounds 450 extend substantially perpendicularly from the metal grid 440, into the respective one or more trenches 420 and reach the substrate 402 exposed at the bottom of the trenches 420 for grounding purpose. In an embodiment of the present disclosure, the metal shield grounds 450 may have a dimension of 1-5 μm width and depth (into the trenches).

In one embodiment, each of the metal shield grounds 450 may have, generally, a configuration of an elongated box-shaped shell with a hollow interior, as shown in FIG. 4E, if the trenches 420 have a configuration of a rectangular hole. But the metal shield may have different configurations as the configuration of the trenches changes. Accordingly, the configuration of the sidewall insulation layer will also change.

Figure 4F:
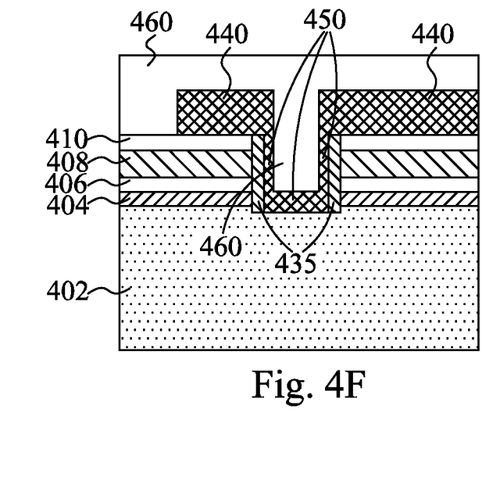

Lastly, at step 318, another insulation layer, the third insulation layer, another oxide layer, may be formed over the conductive layer, over both the metal grid 440 and the metal shield grounds 450 by suitable deposition processes for physical protection and electrical insulation. FIG. 4F shows the so-formed third insulation layer 460. The dielectric material used for the third insulation layer may be same with or different from the first or second insulation layer. The third insulation layer may be formed by CVD, PVD, thermal oxidization, spin-on coating, spin-on dielectric (SOD) process, or other suitable deposition techniques. In an embodiment, the dielectric material of the third insulation layer 460 may completely fill the hollow interior of the metal shield grounds 450 as shown in FIG. 4F. After formation, the third insulation layer 460 may be further planarized to form a smooth surface by a chemical mechanical polishing (CMP) process.

With this method of the present disclosure, the sidewall insulating layer is formed between the side surface of each metal shield ground and exposed side sections of the BARC layers, the first and second insulation layers, and part of the substrate. Thanks to the sidewall insulating layer, each metal shield ground becomes completely separated from, and so electrically insulated from, the adjacent surrounding layers, particularly from the BARC layers. Therefore, the known problem in the current art of unwanted neutralization of any negative charges in the BARC layers by the positive charges in the metal shield grounds can be effectively prevented by the structure and method of the present disclosure.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An image sensor device having a radiation-absorption region and a radiation-blocking region, the image sensor device comprising:
    a substrate having front and back surfaces and extending across both the radiation-absorption and radiation-blocking regions;
    a plurality of radiation sensors formed in the substrate adjacent the front surface in the radiation-absorption region, the radiation sensors being operable to detect radiation waves that enter the substrate through the back surface;
    a first insulation layer formed over the back surface of the substrate;
    an anti-reflective coating layer formed over the first insulation layer;
    a conductive layer formed in the radiation-blocking region, the conductive layer comprising a horizontal portion disposed over the anti-reflective coating layer and one or more vertical portions extending substantially perpendicularly from the horizontal portion, penetrating through the anti-reflective coating layer and the first insulation layer, and reaching the substrate for grounding the conductive layer, each of the one or more vertical portions having a sidewall substantially perpendicular to the horizontal portion; and
    a sidewall insulating layer disposed between the sidewall of each vertical portion and the surrounding anti-reflective coating layer for electric insulation therebetween.

2. The image sensor device of claim 1, wherein the image sensor device is a back side illuminated (BSI) image sensor.

3. The image sensor device of claim 1, further comprising a second insulation layer formed between the horizontal portion of the conductive layer and the anti-reflective coating layer.

4. The image sensor device of claim 1, further comprising a third insulation layer formed over the conductive layer.

5. The image sensor device of claim 1, wherein each sidewall insulating layer is made of an oxide material.

6. The image sensor device of claim 1, wherein each of the one or more vertical portions generally has a configuration of an elongated box-shaped shell.

7. A device comprising:
    a substrate having front and back surfaces;
    a radiation sensor formed in the substrate in a radiation-absorption region adjacent a front surface, the radiation sensor being operable to detect radiation waves that enter the substrate through the back surface;
    an interconnect structure formed on the front surface of the substrate;
    an anti-reflective coating layer formed upon the back surface of the substrate, the anti-reflective coating layer defining therein one or more trenches reaching down to the back surface of the substrate; and
    a metal ground structure comprising:
        a horizontal metal grid formed over a portion of the anti-reflective coating layer for blocking any radiation from entering the back surface of the substrate thereunder;
        one or more metal grounds extending, substantially perpendicularly from the horizontal metal grid, into the anti-reflective coating layer through the one or more trenches, and to the substrate for an electrical grounding purpose, each of the one or more metal grounds having a sidewall substantially perpendicular to the horizontal metal grid; and
        a sidewall insulating layer disposed between the sidewall of each metal ground and the surrounding anti-reflective coating layer for electric insulation therebetween.

8. The device of claim 7, wherein the radiation sensor is part of a back side illuminated (BSI) image sensor.

9. The device of claim 7 further comprising:
    a first insulation layer formed between the substrate and the anti-reflective coating layer.

10. The device of claim 9 further comprising:
    a second insulation layer formed between the horizontal metal grid and the anti-reflective coating layer.

11. The device of claim 10 further comprising:
    a third insulation layer formed over the horizontal metal grid and the one or more metal grounds.

12. The device of claim 7, wherein each sidewall insulating layer is made of an oxide material.

13. The device of claim 7, wherein each of the one or more metal grounds generally has a configuration of an elongated box-shaped shell.

14. A method of fabricating an image sensor device having a radiation-absorption region and a radiation-blocking region, the method comprising:
    providing a substrate extending across both the radiation-absorption and radiation-blocking regions, the substrate having a plurality of radiation sensors formed adjacent the front surface in the radiation-absorption region, the radiation sensors being operable to detect radiation waves that enter the substrate through the back surface;
    forming a first insulation layer over the back surface of the substrate;
    forming an anti-reflective coating layer over the first insulation layer;
    forming one or more trenches defined through the anti-reflective coating layer and the first insulation layer, and partly into the substrate, each trench having an inner trench wall defined by side sections of the anti-reflective coating layer, the first insulation layer, and part of the substrate;
    forming a sidewall insulating layer around each inner trench wall;
    forming a conductive layer comprising horizontal and one or more vertical portions in the radiation-blocking region, wherein the horizontal portion is disposed over the anti-reflective coating layer, and the one or more vertical portions are extending, substantially perpendicularly from the horizontal portion, into the respective one or more trenches while separated from the respective inner trench walls by the respective sidewall insulating layers, and to the substrate for grounding purpose.

15. The method of claim 14, wherein the image sensor device is a back side illuminated (BSI) image sensor.

16. The method of claim 14, further comprising thinning the substrate from the back surface thereof to a desired thickness before the forming of the first insulation layer.

17. The method of claim 14, further comprising forming a second insulation layer over the anti-reflective coating layer before the forming of the anti-reflective coating layer.

18. The method of claim 14, further comprising forming a third insulation layer over the conductive layer.

19. The method of claim 14, wherein each sidewall insulating layer is made of an oxide material.

20. The method of claim 14, wherein each of the one or more vertical portions generally has a configuration of an elongated box-shaped shell.

\* \* \* \* \*